(12) United States Patent
Kent et al.

(10) Patent No.: US 12,315,105 B2
(45) Date of Patent: May 27, 2025

(54) HIGH RESOLUTION IMAGING OF MICROELECTRONIC DEVICES

(71) Applicant: Battelle Memorial Institute, Columbus, OH (US)

(72) Inventors: Thomas F. Kent, Columbus, OH (US); Jeffrey A. Simon, Columbus, OH (US)

(73) Assignee: BATTELLE MEMORIAL INSTITUTE, Columbus, OH (US)

( * ) Notice: Subject to any disclaimer, the term of this patent is extended or adjusted under 35 U.S.C. 154(b) by 268 days.

(21) Appl. No.: 17/830,517

(22) Filed: Jun. 2, 2022

(65) Prior Publication Data
US 2022/0392016 A1     Dec. 8, 2022

Related U.S. Application Data
(60) Provisional application No. 63/208,347, filed on Jun. 8, 2021.

(51) Int. Cl.
*G06T 3/4038*     (2024.01)
*G01R 31/265*     (2006.01)
*G02B 26/08*     (2006.01)

(52) U.S. Cl.
CPC ........ *G06T 3/4038* (2013.01); *G01R 31/2656* (2013.01); *G02B 26/0833* (2013.01)

(58) Field of Classification Search
CPC ............ G01R 31/2656; G02B 26/0833; G06T 3/4038
See application file for complete search history.

(56) References Cited

U.S. PATENT DOCUMENTS

| | | |
|---|---|---|
| 6,414,752 B1 | 7/2002 | Sullivan et al. |
| 6,501,288 B1 | 12/2002 | Wilsher |
| 7,450,245 B2 | 11/2008 | Woods et al. |

(Continued)

FOREIGN PATENT DOCUMENTS

| | | |
|---|---|---|
| JP | 2010181288 A1 | 8/2010 |
| JP | 201631368 A | 3/2016 |

OTHER PUBLICATIONS

International Search Report of Application No. PCT/US2022/031929 Dated Sep. 15, 2022.

(Continued)

*Primary Examiner* — Reena Aurora
(74) *Attorney, Agent, or Firm* — Lippes Mathias LLP (57) ABSTRACT

In an imaging method, a focal point of a focused optical beam is sequentially mechanically positioned at coarse locations in or on an integrated circuit (IC) wafer or chip. At each coarse location, a two-dimensional (2D) image or mapping tile is acquired by steering the focal point to fine locations on or in the IC wafer or chip using electronic beam steering and, with the focal point positioned at each fine location, acquiring an output signal produced in response to an electrical charge that is optically injected into the IC wafer or chip at the fine location by the focused optical beam. The 2D image or mapping tiles are combined, including stitching together overlapping 2D image or mapping tiles, to generate an image or mapping of the IC wafer or chip. The electronic beam steering may be performed using a galvo mirror. The set of coarse locations may span a three-dimensional (3D) volume.

20 Claims, 3 Drawing Sheets

(56) References Cited

U.S. PATENT DOCUMENTS

| | | | |
|---|---|---|---|
| 2012/0312957 A1* | 12/2012 | Loney | G02B 21/245 |
| | | | 250/201.3 |
| 2014/0172345 A1 | 6/2014 | Stoker | |
| 2014/0292363 A1 | 10/2014 | Ng et al. | |
| 2018/0246032 A1 | 8/2018 | Li et al. | |
| 2019/0193204 A1 | 6/2019 | Houbertz et al. | |
| 2019/0324244 A1 | 10/2019 | Kozorovitskiy et al. | |
| 2020/0110029 A1 | 4/2020 | Lei | |
| 2021/0052160 A1* | 2/2021 | König | G02B 21/0028 |
| 2022/0291282 A1* | 9/2022 | Kent | H01S 3/06716 |

OTHER PUBLICATIONS

Chris Zu, et al., "Two-photon optical beam induced current imaging through the backside of integrated circuits" Applied American Physics Letters, American Institute of Physics, Huntington Quadrangle, Melville, NY, 11474, vol. 71, No. 18, Nov. 3, 1997. Figure 1 p. 2578, right col. second paragraph.

English Translation of Japanese Office action for Application No. 2023-575597 Dated Dec. 20, 2024.

\* cited by examiner

HIGH RESOLUTION IMAGING OF MICROELECTRONIC DEVICES

This application claims the benefit of U.S. Provisional Application No. 63/208,347 filed Jun. 8, 2021 and titled "HIGH RESOLUTION IMAGING OF MICROELECTRONIC DEVICES", which is incorporated herein by reference in its entirety.

BACKGROUND

The following relates to the microelectronics arts, integrated circuit (IC) arts, non-destructive IC testing and characterization arts, non-destructive memory extraction arts, IC failure analysis arts, non-destructive IC imaging arts, and to like applications.

Optical carrier injection employs an optical beam (typically a laser beam) that is focused on a specific location of an active layer of an IC to excite electron-hole pairs at that location. The excited electron-hole pairs constitute the optically injected carriers. To produce the desired carrier injection, the photon energy of the optical beam is typically higher than the bandgap of the active layer.

There are numerous applications of optical carrier injection. For example, scanning of optical carrier injection across an IC wafer or chip can be used to produce an image of the IC. The output signal for such imaging can be an electrical voltage or current or impedance measured across chosen terminals of the IC, reflectivity measurements, or so forth.

In general, an IC wafer or chip includes a substrate that provides the structural support, and an active layer disposed on a frontside of the substrate. The active layer is typically very thin, e.g. a few tens of microns or less in thickness, and hence is usually not self-supporting. The substrate is usually in the form of a wafer or chip that is around 100 microns thick or thicker and provides the structural support for the IC wafer or chip. In fabrication, it is common to manufacture a two-dimensional array of partially or wholly completed ICs by wafer-level processing performed on a large substrate wafer (e.g. 300 mm diameter, 400 mm diameter, or larger or smaller diameter), and after the wafer-level processing the wafer is diced to separate the individual ICs. Hence, the term "IC wafer or chip" broadly encompasses the IC before dicing (an IC "wafer") or after dicing (an IC "chip"). The "frontside" of the substrate is the side on which the active layer is disposed or fabricated. The active layer may be a single layer, or a stack of layers, possibly including doping features such as n-wells or p-wells, features such as quantum wells or dots, polysilicon layers, and/or so forth. Various metallization traces, insulating layers, and/or the like may be disposed on the active layer, or if the active layer is a stack then metallization trace layers and/or insulating layers may be interspersed amongst the layers of the stack. The substrate also has a "backside" which is opposite from the front side. Because the active layer is fabricated on the front side of the substrate, optical carrier injection in which the optical beam is applied on the frontside (i.e., frontside optical carrier injection) can, in principle, achieve a tight focal point and consequent high spatial resolution for the optical carrier injection. However, in practice frontside optical carrier injection can be adversely affected by metallization traces, insulating layers, or the like which are typically disposed at or near the top of the active layer (i.e., distal from the substrate).

Backside optical carrier injection can be used to optically inject carriers into the active layer while avoiding interference from the metallization traces or other IC features located at or near the top of the active layer. In this approach, the optical beam is applied on the backside of the substrate and travels through the substrate to reach the active layer disposed on the frontside of the substrate. However, there is a difficulty with backside optical carrier injection. Often, the active layer is fabricated of the same material as the substrate, as is usually the case for mature silicon technologies, or may be fabricated of a material with a higher bandgap than the bandgap of the substrate material. In these cases the bandgap of the substrate is comparable to or smaller than the bandgap of the active layer, and the backside illumination used for optical carrier injection has photon energy higher than the bandgap of the substrate. Hence, the illumination will be absorbed by the substrate before it can reach and be absorbed by the active layer.

To reduce or eliminate substrate light absorption, the substrate can be thinned or removed by mechanical, chemical, or mechanochemical processing, and/or polished to reduce optical roughness. However, these are destructive processes, which is undesirable for some applications. The wafer thinning or removal is also a time-consuming and often delicate process, as the IC with the substrate thinned or removed is fragile. (As previously noted, the active layer is typically too thin to be self-supporting). Additionally, the substrate thinning or removal can alter the functional behavior of the IC wafer or chip, by mechanisms such as introducing mechanical strain and/or structural defects into the active layer, modifying the thermal heatsinking of the active layer, modifying optical behavior of an optoelectronic IC (if the substrate acts as a light guide, for example), and/or so forth.

In some applications, optical carrier injection is used to generate an image of the IC wafer or chip. To do so, the IC wafer or chip is typically mounted on a mechanical translation stage and is moved relative to the optical beam used for the optical carrier injection in order to perform the optical carrier injection at locations of a grid of locations. For each location an output signal is measured, which is generated by the optically injected charge. The output signal may, for example, be a light output signal or an electrical signal measured at terminals of the IC wafer or chip. The measured output signals at the locations of the grid then form an image of the IC wafer or chip.

However, a problem with such an imaging method is that it can be a time-consuming process, especially if the grid of locations is desired to be dense so as to provide the image at high spatial resolution. Furthermore, limits on the tolerances of the mechanical translation mechanisms of the mechanical translation stage can limit the achievable spatial resolution of the image.

Certain improvements are disclosed herein.

BRIEF SUMMARY

In accordance with some illustrative embodiments disclosed herein, an imaging method is disclosed. A focal point of a focused optical beam is sequentially mechanically positioned at coarse locations of a set of coarse locations in or on an integrated circuit (IC) wafer or chip. With the focal point of the focused optical beam positioned at each coarse location, a two-dimensional (2D) image or mapping tile is acquired by steering the focal point of the focused optical beam to fine locations of a 2D set of fine locations on or in the IC wafer or chip using electronic beam steering of the focused optical beam and, with the focal point of the focused optical beam positioned at each fine location, acquiring an output signal produced in response to an electrical charge that is optically injected into the IC wafer or chip at the fine location by the focused optical beam. Using an electronic processor, the 2D image or mapping tiles are combined, including stitching together overlapping 2D image or mapping tiles, to generate an image of the IC wafer or chip. The method optionally further comprises displaying the image of the IC wafer or chip on a display. In some embodiments, the electronic beam steering is performed using a galvo mirror. The set of coarse locations in or on the IC wafer or chip may optionally span a three-dimensional (3D) volume, and the image of the IC wafer or chip is then a 3D image of the IC wafer or chip.

In some embodiments of the imaging method of the immediately preceding paragraph, the IC wafer or chip comprises an active layer disposed on a frontside of a substrate, the focused optical beam comprises a pulsed focused optical beam having pulse duration of 900 femtoseconds or lower and a photon energy that is lower than a bandgap of the substrate, the set of coarse locations in or on the IC wafer or chip are in the active layer, the focused laser beam is arranged to pass through the substrate to reach the coarse locations, and the output signal is produced in response to an electrical charge that is optically injected into the IC wafer or chip at the fine location by two-photon absorption of the focused laser beam at the fine location. In some such embodiments, the focused optical beam is generated using a fiber laser in which the fiber is doped with ytterbium and/or erbium.

In accordance with some illustrative embodiments disclosed herein, an imaging device comprises: means for sequentially mechanically positioning a focal point of a focused optical beam at coarse locations of a set of coarse locations in or on an IC wafer or chip; means for, with the focal point of the focused optical beam positioned at each coarse location, acquiring a 2D image tile; and means, including an electronic processor, for combining the 2D image tiles including stitching together overlapping 2D image tiles to generate an image of the IC wafer or chip. The means for acquiring the 2D image tile includes: (i) means for steering the focal point of the focused optical beam to fine locations of a 2D set of fine locations on or in the IC wafer or chip using electronic beam steering, and (ii) means for, with the focal point of the focused optical beam positioned at each fine location, acquiring an output signal produced in response to an electrical charge that is optically injected into the IC wafer or chip at the fine location by the focused optical beam. The means for sequentially mechanical positioning may comprise a mechanical translation stage on which the IC wafer or chip is disposed. The means for steering may comprise a galvo mirror for electronically steering the focused optical beam. The imaging device may further include means for generating the focused optical beam, including a fiber laser in which the fiber is doped with ytterbium and/or erbium.

In accordance with some illustrative embodiments disclosed herein, an imaging device is disclosed. A laser and an optical train are configured to generate a focused optical beam. A mechanical translation stage is provided, on which an IC wafer or chip is disposed. The mechanical translation stage is operable to sequentially position a focal point of the focused optical beam at coarse locations of a set of coarse locations in or on the IC wafer or chip. A beam steering device is configured to, with the focal point of the focused optical beam positioned at each coarse location, steer the focal point of the focused optical beam to fine locations of a 2D set of fine locations on or in the IC wafer or chip using electronic beam steering. A readout device is configured to, with the focal point of the focused optical beam positioned at each coarse location, acquire a 2D image or mapping tile for each coarse position by acquiring output signals produced in response to electrical charge that is optically injected into the IC wafer or chip at the fine locations of the 2D set of fine locations by the focused optical beam. In some embodiments, an electronic processor is programmed to combine the 2D image or mapping tiles to generate an image of the IC wafer or chip including stitching together overlapping 2D image or mapping tiles. The beam steering device may comprise a galvo mirror. The optical train may include an f-theta scan lens and an objective. The readout device may comprise one or more of a voltmeter, an ammeter, an ohmmeter, a spectrometer, a spectrograph, and/or an optical detector. The imaging device may optionally further comprise a display configured to display the image of the IC wafer or chip.

BRIEF DESCRIPTION OF THE DRAWINGS

Any quantitative dimensions shown in the drawing are to be understood as non-limiting illustrative examples. Unless otherwise indicated, the drawings are not to scale; if any aspect of the drawings is indicated as being to scale, the illustrated scale is to be understood as non-limiting illustrative example.

DETAILED DESCRIPTION

Figure 1:
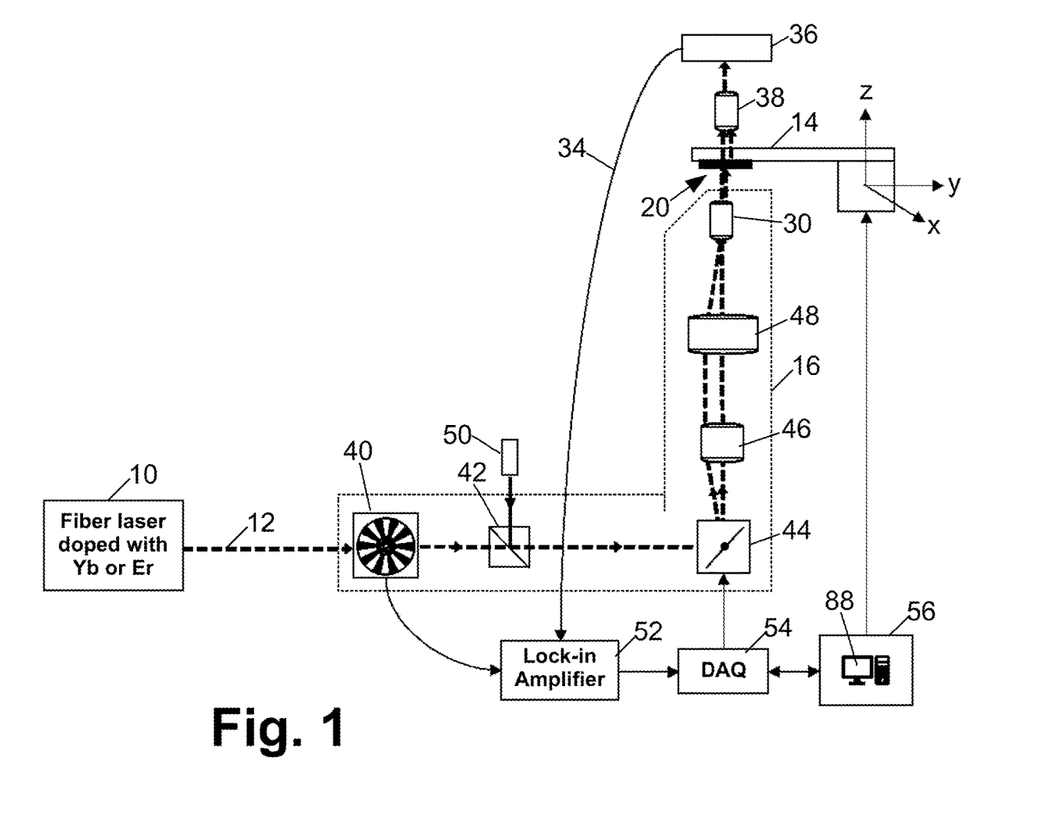
FIG. 1 diagrammatically illustrates an optical carrier injection device.

With reference to FIG. 1, an optical carrier injection device includes a light source (e.g., an illustrative laser) 10 which outputs a pulsed optical beam 12 (diagrammatically indicated by a dashed line in FIG. 1). A mechanical translation stage 14 holds an IC wafer or chip 20 by way of adhesive, a vacuum chuck, sample clips, or the like (details not shown). In another approach, the IC wafer or chip 20 may be mounted on a printed circuit board (PCB) that is in turn mounted to the translation stage 14 by screws or other fasteners. The illustrative mechanical translation stage 14 is a three-axis translation stage providing controllable translation in any of three mutually orthogonal directions labeled (without loss of generality) in FIG. 1 as the x-, y-, and z-directions. An optical train 16 is arranged to apply the pulsed optical beam 12 output by the laser 10 to the IC wafer or chip 20 held by the translation stage 14.

Figure 2:
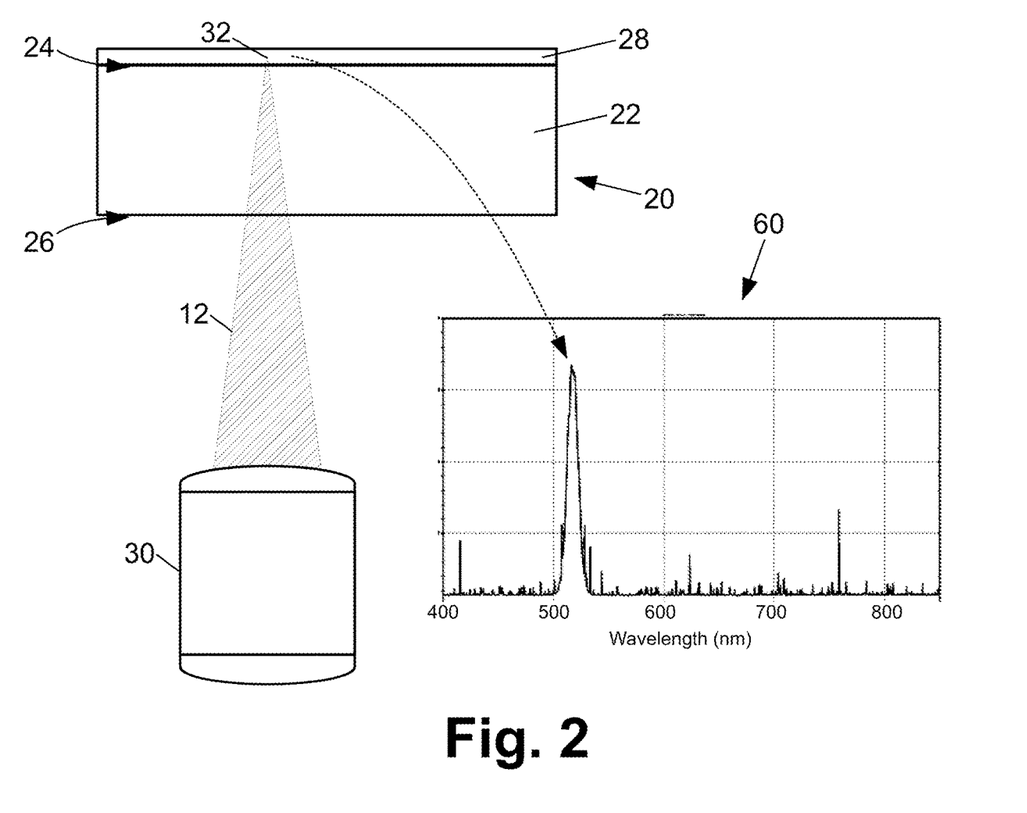
FIG. 2 diagrammatically illustrates the optical carrier injection by nonlinear optical interactions achieved using the optical carrier injection device of FIG. 1.

With reference to FIG. 2 an enlarged diagrammatic representation of the IC wafer or chip 20 is shown. The IC wafer or chip 20 includes a substrate 22 having a frontside 24 and a backside 26, and an active layer 28 disposed on the frontside 24 of the substrate 22. In general, the active layer 28 may be disposed on the frontside 24 of the substrate 22 in various ways, depending upon the IC technology that is employed. In the case of some silicon fabrication processes, the active layer 28 is fabricated on the frontside 24 of the substrate 22 by process steps such as ion implantation, dopant diffusion, or so forth that modify the topmost portion of the frontside 24 of the substrate 22 to form the active layer 28. In other silicon fabrication technologies, the active layer 28 may comprise one or more epitaxial silicon layers that are deposited on the frontside 24 by deposition techniques such as vacuum evaporation, sputtering, chemical vapor deposition, or so forth. In a variant approach, one or more of the deposited layers may be of a group IV material that is different from silicon, such as germanium (Ge) or an alloy of silicon and germanium (SiGe). The active layer 28 could additionally or alternatively include one or more deposited layers of a different material type such as a III-V or II-VI compound semiconductor. In the foregoing examples, the substrate 22 is a silicon substrate. However, more generally, the substrate 22 may be made of a different material, such as gallium arsenide (GaAs), indium phosphide (InP), or so forth, as technologies employing these materials are often used for optoelectronic IC wafers or chips. Typically (although not necessarily) the active layer 28 is made of the same material as the substrate 22 or of a compatible similar material. Some examples of the latter include: a SiGe active layer on a silicon substrate; a GaAs active layer on a GaAs substrate; an aluminum gallium arsenide (AlGaAs) active layer on a GaAs substrate; an active layer comprising a stack of alternating GaAs/AlGaAs layers on a GaAs substrate; a lattice-matched InGaAs layer on an InP substrate; and/or so forth. These are merely non-limiting illustrative examples. In the following, and for illustrative purposes only, the substrate 22 is assumed to be a silicon substrate and the active layer 28 is likewise assumed to be a silicon or stack of silicon layers (e.g. with different doping type/levels). Although not shown, it will be appreciated that the IC wafer or chip 22 may include additional features such as metallization traces, electrically insulating layers (e.g., deposited oxide layers and/or silicon oxide layers formed by oxidation of the topmost portion of the frontside 24 of the substrate 22), and/or so forth.

With continuing reference to FIGS. 1 and 2, the optical train 16 includes an objective 30 arranged to focus the pulsed optical beam 12 at a focal point 32 in the active layer 28 disposed on the frontside 24 of the substrate 22. As seen in FIG. 2, the illustrated optical carrier injection thus employs backside optical carrier injection in which the pulsed optical beam 12 passes through the substrate 22 to reach the active layer 28 disposed on the frontside 24 of the substrate 22. As previously noted, backside optical carrier injection has advantages in avoiding scattering from the metallization traces or other IC features located at or near the top of the active layer. However, backside optical carrier injection is typically impractical when the bandgap of the substrate is comparable to or smaller than the bandgap of the active layer, because for optical carrier injection the optical beam should have photon energy higher than the bandgap of the substrate, and hence the illumination will be absorbed by the substrate before it can reach and be absorbed by the active layer. This can be addressed thinning or removing the substrate, but as previously noted there are numerous disadvantages that approach.

Various aspects of the disclosed optical carrier injection address this problem by utilizing absorption by nonlinear optical interactions to inject electrical charge into the active layer 28 by way of backside optical carrier injection using the laser (or other light source) 10 that outputs light with photon energy below the bandgap of the substrate 22, and preferably also below the bandgap of the active layer 28. A consequence of the photon energy of the pulsed optical beam 12 being below the bandgap of the substrate 22 is that the beam 12 passes through the substrate 22 with little or no absorption. Hence, the optical carrier injection methods disclosed herein preferably do not include thinning or removing the substrate 22 of the IC wafer or chip 20. Additionally, polishing of the backside 26 of the substrate 22 is typically not required. Typically, the backside is polished in traditional applications employing backside illumination, in order to reduce spurious signals due to scattering. However, for absorption by nonlinear optical interaction(s), the scattering on an optically rough surface does not significantly degrade the resolution because the scattered light is at a too low of intensity to generate nonlinear optical interactions and only would minimally affect the signal.

If only linear absorption were considered, the pulsed optical beam 12 would also pass through the active layer 28 with little or no absorption that results in carrier injection. However, as diagrammatically shown in FIG. 2, the objective 30 operates to focus the pulsed optical beam 30 at the focal point 32 in the active layer 28. This results in high light intensity (and correspondingly high electric field intensity) at the focal point 28 as all the optical energy of the beam 30 is concentrated at the focal point 32. The high electric field can induce absorption by nonlinear optical interactions such as, for example, two-photon absorption (TPA), absorption of an optical beam created by third-harmonic generation (THG) in the active layer, absorption of an optical beam created by higher-harmonic generation in the active layer, or another nonlinear optical interaction or combination of nonlinear optical interactions. In nonlinear optical interaction processes such as two-photon absorption, the absorption is typically proportional to the square, cube, or higher order polynomial of the light intensity. The focused beam produces sufficient intensity at the focal point 32 so that a portion of the optical energy of the pulsed optical beam 30 is absorbed by the active layer 28 at the focal point 32 by way of two-photon absorption or other nonlinear optical interaction(s), and this absorbed optical energy is sufficient to (optically) inject carriers into the active layer 28 at the focal point 32.

A challenge with this approach leveraging absorption by nonlinear optical interaction is that the high light intensity at the focal point 32 can result in rapid heating at the focal point 32, due to the optical power being deposited at the focal point 32. This is minimized in the disclosed optical carrier injection techniques by pulsing the optical beam 12 so that each pulse has pulse duration of 900 femtoseconds or lower. In other words, the laser 10 is a femtosecond laser. In some embodiments, the laser 10 is a fiber-based femtosecond laser, as discussed below. The pulses are separated by time intervals of sufficient length to allow for heat dissipation between the pulses. For example, the femtosecond laser operates at 50-100 MHz in some non-limiting illustrative embodiments, so that successive femtosecond pulses are spaced apart by time intervals of around 10-20 nanoseconds. Hence, the pulsed optical beam 12 deposits sufficient optical energy in each pulse to produce two-photon absorption or other absorption by nonlinear optical interaction(s), but the (time-averaged) power of the pulsed optical beam 12 is low enough to avoid problematic heating at the focal point 32.

By way of non-limiting illustrative example, if the substrate 22 is a silicon substrate then its bandgap is typically around 1.1 eV, although the precise bandgap energy depends on dopant or impurities type and level. For this case, the photon energy of the pulsed optical beam 12 is preferably 1.0 eV or lower to be below the silicon bandgap. The active layer 28 in this case may be a silicon-based active layer, although an active layer comprising another material is contemplated. Some suitable femtosecond lasers with this photon energy include fiber lasers in which the fiber is doped with ytterbium (Yb) and/or erbium (Er), which can achieve desirable operating parameters for use with a silicon substrate such as pulse duration of 900 femtoseconds (fs) or lower and (average) optical power of 150 milliwatts (mW) or higher, although lower power is also contemplated, e.g. pulsed optical beam having an average optical power of at least 10 milliwatts in some broader embodiments. Some suitable femtosecond fiber lasers of this type with photon energy on the order of 1550-1560 nm (photon energy ~0.80 eV), pulse frequencies in a range of 50-100 MHz, and average optical power of 150 mW or higher are available from Menlo Systems GmbH, Martinsried, Germany.

The optical carrier injection system is further configured to measure an output signal 34 produced in response to the carriers injected at the focal point 32 by two-photon absorption or absorption by other nonlinear optical interaction process(es). The output signal 34 may, for example, be an electrical signal produced by the IC wafer or chip 20 in response to the carriers injected at the focal point 32 in the active layer 28, or a light output signal produced by recombination of the carriers injected at the focal point 32 in the active layer 28 or nonlinear interactions in the active layer. In the illustrative system of FIG. 1, the output signal 34 is a light output signal that is measured using a photodetector 36 for detecting the light output which is focused on the photodetector 36 by a light output collection objective 38. If the output signal 34 is an electrical signal produced by the IC wafer or chip 20, this may for example be measured as an electrical voltage or current or impedance measured across chosen terminals of the IC wafer or chip 20. (The choice of terminals is suitably based on a priori knowledge of the architecture of the IC wafer or chip 20). As further non-limiting illustrative examples, the readout device producing the output signal 34 may comprise one or more of a voltmeter, an ammeter, an ohmmeter, a spectrometer, a spectrograph, and/or an optical detector. In some applications multiple output signals may be measured, such as a light output signal and one or more electrical signals measured across various pairs of terminals of the IC wafer or chip 20.

Conversely, it is noted that the measurement of an output signal is optional; in some embodiments such as optically programming an IC memory by setting specific memory elements to specific charge states, no output signal may be measured.

In addition to the objective 30, the illustrative optical train 16 of FIG. 1 includes a mechanical chopper 40, a beam splitter 42, a galvo mirror 44, an f-theta scan lens 46, and a tube lens 48 that inputs to the objective 30. Other optical components are also contemplated for inclusion in the optical train 16, such as an attenuator to reduce the laser power. The beam splitter 42, along with a low power alignment laser 50 emitting visible light (e.g., a red or green helium-neon, i.e. HeNe, laser), are optional components used to align the optical train 16. The chopper 40 operates in conjunction with a lock-in amplifier 52 to provide a high sensitivity detector for detecting the output signal 34. The chopper 40 typically operates at a much lower frequency than the femtosecond laser 10, e.g. in one non-limiting illustrative embodiment the chopper 40 operates at 1 kHz while the femtosecond laser 10 produces the pulsed optical beam 12 with a pulse frequency of 100 MHz. Rather than employing the chopper 40, another type of lock-in amplification can be used, such as radio frequency (RF) lock-in amplification in which the lock-in amplifier 52 is a generated signal at the repetition rate of and phase-locked to the pulsed output laser 10, or boxcar averaging triggered from the laser pulses. Both phase and magnitude of the signal from the lock-in can be measured, and the phase can advantageously provide information about how data is transferred.

As noted previously, another problem with optical carrier injection systems, especially when used for imaging, is that it can be a time-consuming process if the grid of locations dense so as to provide the image at high spatial resolution. Furthermore, limits on the tolerances of the mechanical translation mechanisms of the mechanical translation stage can limit the achievable spatial resolution of the image.

To address this problem, the optical carrier injection system of FIG. 1 employs the illustrative galvo mirror 44 (or another electronic beam steering device such as a MEMS-based deformable mirror, piezoelectric deformable mirror, acousto-optic beam steering, electro optic beam steering) to electronically steer the pulsed optical beam 12 to acquire a small region of the image, referred to herein as a two-dimensional (2D) image tile. More generally, in some embodiments a multi-valued dataset is acquired for reach small region, referred to as a 2D mapping tile. In the illustrative system of FIG. 1, the beam steering device 44 is a galvo mirror, and the f-theta scan lens 46 corrects for the angular deflection of the pulsed optical beam 12 introduced by the galvo mirror 44. The lateral movement of the beam is thus determined by the angle of the galvo mirror 44 and the spacing between the galvo mirror 44 and the f-theta scan lens 46.

With the focal point 32 of the focused optical beam 12 positioned at a coarse location arrived at by operation of the mechanical translation stage 14, a 2D image or mapping tile is acquired by: (i) steering the focal point 32 of the focused optical beam 12 to fine locations of a 2D set of fine locations on or in the IC wafer or chip 20 using electronic beam steering (via the galvo mirror 44 or other electronic beam steering device); and (ii) with the focal point of the focused optical beam positioned at each fine location, acquiring the output signal 34 produced in response to an electrical charge that is optically injected into the IC wafer or chip 20 at the fine location by the focused optical beam 12. In the illustrative embodiment of FIG. 1, digital acquisition hardware (DAQ) 54 is used to control the galvo mirror 44 (or other electronic beam steering device) to perform the steering (i) and the output signal acquisition (ii), the latter being performed in conjunction with the lock-in amplifier 52 used with a reference signal derived from the chopping performed by the mechanical chopper 40 (or, alternatively, using RF lock-in amplification with a generated signal at the repetition rate of and phase-locked to the pulsed output of the laser 10 as the reference) to provide good noise rejection. In some illustrative embodiments, a DAQ from National Instruments Corporation (Austin, Texas, USA) is used as the DAQ 54. The overall image acquisition is controlled by a computer 56 that controls the DAQ 54 to control image or mapping tile acquisition and to receive the acquired image or mapping tiles, and the computer 56 controls the mechanical translation stage 14 to sequentially mechanically position the focal point 32 of the focused optical beam 12 at coarse locations of a set of coarse locations in or on the IC wafer or chip 20. While the 2D image or mapping tile is a two-dimensional image, if the translation stage 14 is a three-dimensional (3D) translation stage (as illustrated in FIG. 1), then the set of coarse locations may be a 2D array of coarse locations providing a final image that is 2D; or, the set of coarse locations may be a 3D array of coarse locations providing a final image that is 3D (i.e., volumetric) albeit with coarse resolution in the depth (z) direction determined by the spacing of the coarse locations along the z-direction.

The computer 56 is programmed by suitable software to combine the 2D image or mapping tiles. To provide smooth image content at the tile boundaries, neighboring image or mapping tiles preferably overlap (for example, achieved by setting the spacing between adjacent coarse locations to be smaller than the size of the image or mapping tiles) and the image or mapping tiles are combined by stitching together overlapping 2D image or mapping tiles to generate an image of the IC wafer or chip 20. In one non-limiting illustrative approach, the computer 56 is programmed to perform the image stitching by executing pairwise and/or grid/collection stitching plugins of the ImageJ image processing suite (available at imagej.net and github.com/imagej/imagej1).

While the illustrative embodiment of FIG. 1 employs the DAQ 54 and computer 56 for control and processing of the image acquisition, more generally these control and processing operations can be performed by an electronic processor. The electronic processor 54, 56 may comprise a computer that directly controls both the stage 14 and galvo mirror 44 and is connected to receive the signal output from the lock-in amplifier 52; or may comprise the illustrated combination of a DAQ 54 and computer 56; or may comprise a specially-constructed microprocessor- or microcontroller- or FPGA-based controller; or may comprise a cloud-based server computer; or may comprise various combinations thereof; and/or so forth.

An optical carrier injection system of the configuration shown in FIG. 1 was actually constructed and tested. The system employed a Menlo Systems 1550-1560 nm Yb:fiber laser with 100 fs pulses, operating at a pulse rate of 100 MHz and (average) optical power of 300 mW. A galvo mirror was used as the electronic beam steering device 44, with scan parameters 3-degrees by 3-degrees scan range with 0.5-20 ms/deg dwell. The objective 30 was a 10× to 100× objective, depending on the desired imaging magnification, and the mechanical translation stage 14 was operated to acquire a two-dimensional 7×7 grid of coarse locations with 0.75 mm/step size (4.5 mm scan dimension), or other grid and step size combination depending on the desired image dimensions. The chopper 40 was operated at 1-5 kHz and the lock-in amplifier 52 operated in a current input mode in the picoampere (pA) range with a 1 ms to 3 ms time constant. In other experiments, RF lock-in amplification was used, with the reference signal being the 100 MHz RF signal output from the laser 10 which is locked to the pulsed output of the laser. For imaging or spatial mapping tasks, the image or mapping tiles were stitched together using the Fiji open source implementation of ImageJ (Fiji is an acronym for "Fiji Is Just ImageJ"). It is to be appreciated that these are merely illustrative values used in experiments, and that other values and value combinations for these various parameters are expected to be suitable depending on the specific hardware and the optical carrier injection task being performed.

With reference to FIG. 2, in one experiment, the output 34 was a light output signal produced by two-photon absorption or other nonlinear optical interaction, with the photodetector 36 being a silicon photodetector. The plot 60 shown in FIG. 2 is a plot of the light output having a peak in the green range of the visible spectrum, confirming that the light output signal was generated in response to third-harmonic generation in the active layer.

In another experiment, imaging by optical carrier injection was performed on a commercially available 8-bit microcontroller IC. In this case, the image is an optical beam-induced current (OBIC) image in which the output 34 was electrical voltage across the power terminals, measured in microvolts (μV). Compared with imaging using an 800 nm pump laser providing linear absorption and a 1× telecentric scan lens, the image obtained using the system of FIG. 1 was significantly higher in both spatial resolution and image contrast.

Figure 3:
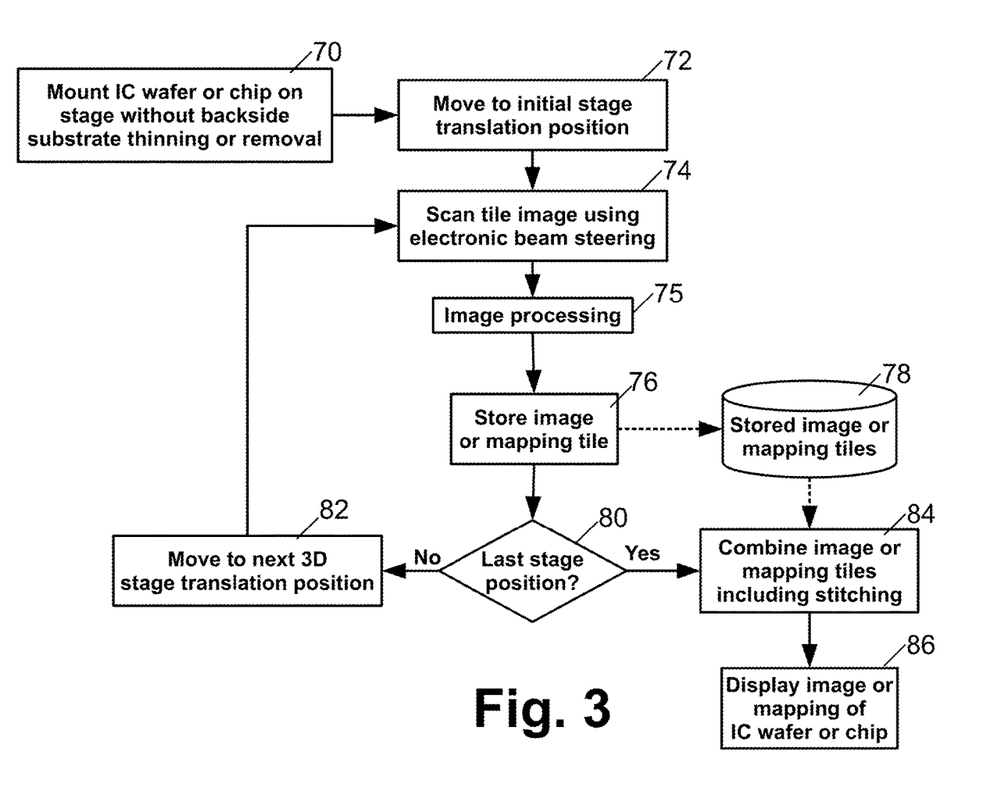
FIG. 3 diagrammatically illustrates an IC wafer or chip imaging process suitably performed using the optical carrier injection device of FIG. 1.

With reference to FIG. 3, an imaging method suitable performed by the optical carrier injection system of FIGS. 1 and 2 is shown by way of a flowchart. In an operation 70, the IC wafer or chip 20 is mounted on the mechanical translation stage 14. Preferably, the mounting operation 70 does not include thinning or removing or polishing the substrate 22 of the IC wafer or chip 20. In an operation 72, the mechanical translation stage 14 is operated to move to the initial 2D or 3D stage translation position (2D or 3D depending on whether the stage 14 includes z-direction "depth" movement, and if so whether the set of coarse points is 2D or 3D). In an operation 74, the electronic beam steering device 44 scans the image or mapping tile at the current stage translation position (i.e. current coarse location). More particularly, in the operation 74 the beam steering device 44 is operated to steer the focal point 32 of the focused optical beam 12 to fine locations of a 2D set of fine locations on or in the IC wafer or chip 20 and, at each fine location, the output signal 34 produced in response to an electrical charge that is optically injected into the IC wafer or chip 20 at the fine location by the focused optical beam 12 is measured. In illustrative FIG. 1, the beam steering device 44 is the illustrative galvo mirror 44 which provides electromechanical beam steering. In other embodiments, the beam steering device may employ electro-optical modulation which can provide higher speed electronic beam steering. Typically, the set of fine locations defines a two-dimensional grid of fine locations in the x-y plane.

In an optional image processing operation 75, the acquired image or mapping tile may be processed. For example, a transformation may be performed from the analog signal that is collected at a spatial position to a multi-channel bitmap image which facilitates the subsequent stitching. As another example, the output signal 34 acquired at each fine location could include a waveform, and the acquiring of the 2D image tile further includes processing the waveform acquired at each fine location using the electronic processor 54, 56 to produce a single value for the fine location in the 2D image tile. As another example, the output signal 34 acquired at each fine location could include data collected from two or more sensors, and the acquiring of the 2D image tile further includes processing the data collected from two or more sensors at each fine location using the electronic processor 54, 56 to produce a single value for the fine location in the 2D image tile. In the latter example, the sensors could include an electrical signal produced by the IC wafer or chip 20 in response to the injected carriers and measured by a voltmeter or the like, and an optical signal produced by nonlinear harmonic generation measured by the photodetector 36. As yet another variant, the processing 75 may produce a reduced dataset, but not a single value, for each fine location. For example, if the output signal 34 acquired at each fine location is a peaked waveform then the processing 75 may generate a triplet (A, P, W) where A is the peak amplitude, P is the peak position, and W is the peak full-width-at-half-maximum (FWHM). In this case, the output is the triplet (A, P, W) at each fine location, thus constituting a generalized mapping tile rather than an image tile having a single value at each fine location. As another approach, if the reduced dataset is relatively small, it is contemplated to combine the values to form a single value in the form of a color pixel value, for example using a red-green-blue (RGB) color space or a YUV-type color space to encode a triplet dataset. In this case the output is an image with a single value at each fine location, in which that single value is an (RGB) or (YUV) color space point, producing a false-color image.

In an operation 76, the acquired image tile (or mapping tile) is stored in a storage 78 (e.g., flash memory, solid-state drive, magnetic disk, random-access memory or RAM, et cetera). At a decision 80 it is determined whether this is the last coarse location to be imaged. If not, then flow passes to operation 82 at which the mechanical translation stage 14 is operated to move to the next stage translation position (that is, the next coarse location), and the operations 74, 76, 80 are thus repeated until the image or mapping tiles corresponding to all coarse locations of the set of coarse locations are acquired. Typically, the set of coarse locations forms a 2D grid in the x-y plane, or a 3D grid over in x-y-z space.

When the image or mapping tile for the last coarse location has been acquired and stored, the decision 80 transfers flow to an operation 84 which combines the image or mapping tiles, including stitching together the image or mapping tiles, to generate the image of the IC wafer or chip. For example, the stitching may employ Fiji or another implementation of ImageJ. Optionally, the image may be displayed in an operation 86, for example on a display 88 of the computer 56 (see FIG. 1). In the case where a mapping with a multi-valued dataset at each fine location (rather than an image with a single value at each fine location), so that mapping tiles are to be stitched together, various types of stitching may be employed. For the illustrative example in which the triplet (A, P, W) is output at each fine location, the stitching could operate as already described but applied to each field of the triplet, e.g. the amplitude (A), peak position (P), and width (W) values may each be stitched together independently. In another approach, the registration used in stitching one of the field in the triplet could be used to stitch the other fields in the triplet. For example, registration data generated by the stitching together of the overlapping 2D image or mapping tiles may be used to determine the spatial relation of the output signal acquired at each fine location between different tiles.

In the method of FIG. 3, the operation 74 of scanning the tile image or mapping is assumed to employ optical carrier injection by two-photon absorption or other nonlinear optical interaction process(es) as described herein with reference to FIGS. 1 and 2. However, more generally, the operation 74 can alternatively employ optical carrier injection using linear absorption of the optical beam (rather than using nonlinear absorption process(es) as in the embodiments of FIGS. 1 and 2). For example, the operation 74 can scan the tile image using conventional optical beam-induced current (OBIC) in which the photons are absorbed by conventional linear absorption. To achieve linear absorption of the light, such techniques would generally be performed with the photon energy of the optical beam being higher than the bandgap of the active layer. Furthermore, if the substrate has a bandgap that is smaller than or comparable to the bandgap of the active layer, then either the beam is applied to the frontside of the substrate so that it is not absorbed by the substrate, or the beam is applied from the backside of the substrate but with the substrate thinned or removed before scanning.

These imaging techniques employing linear absorption are still expected to benefit from the tile image acquisition approach of FIG. 3. In one benefit, the electronic beam steering is fast compared with scanning using only the mechanical translation stage, thereby providing faster image acquisition. In another benefit, the image or mapping tiles acquired using the electronic beam steering can often achieve higher spatial resolution than can be achieved by using the mechanical translation stage alone, due to limits on the tolerances of the mechanical translation mechanisms of the mechanical translation stage which limit the achievable spatial resolution.

The preferred embodiments have been illustrated and described. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. An imaging method comprising:
sequentially mechanically positioning a focal point of a focused optical beam at coarse locations of a set of coarse locations in or on an integrated circuit (IC) wafer or chip;
with the focal point of the focused optical beam positioned at each coarse location by the mechanical positioning, acquiring a two-dimensional (2D) image or mapping tile by:
steering the focal point of the focused optical beam to fine locations of a 2D set of fine locations on or in the IC wafer or chip using electronic beam steering of the focused optical beam and,
with the focal point of the focused optical beam positioned at each fine location by the steering, acquiring an output signal produced in response to an electrical charge that is optically injected into the IC wafer or chip at the fine location by the focused optical beam, the acquiring of the output signal including acquiring an electrical signal produced by the IC wafer or chip in response to the electrical charge that is optically injected into the IC wafer or chip at the fine location by the focused optical beam; and
using an electronic processor, combining the 2D image or mapping tiles including stitching together overlapping 2D image or mapping tiles to generate an image of the IC wafer or chip.

2. The imaging method of claim 1 wherein the sequentially mechanical positioning of the focal point of the focused optical beam comprises translating the IC wafer or chip relative to the focal point of the focused optical beam using a mechanical translation stage on which the IC wafer or chip is disposed.

3. The imaging method of claim 1 wherein the electronic beam steering is performed using a galvo mirror.

4. The imaging method of claim 3 further comprising:
focusing an optical beam at the focal point using an optical train including an f-theta scan lens and an objective to generate the focused optical beam.

5. The imaging method of claim 1 wherein the set of coarse locations in or on the IC wafer or chip spans a three-dimensional (3D) volume, and the image of the IC wafer or chip is a 3D image of the IC wafer or chip.

6. The imaging method of claim 1 wherein the output signal is produced by nonlinear optical interaction.

7. The imaging method of claim 1 wherein:
the IC wafer or chip comprises an active layer disposed on a frontside of a substrate;
the focused optical beam comprises a pulsed focused optical beam having pulse duration of 900 femtoseconds or lower and a photon energy that is lower than a bandgap of the substrate;

the set of coarse locations in or on the IC wafer or chip are in the active layer;
the focused laser beam is arranged to pass through the substrate to reach the coarse locations; and
the output signal is produced in response to an electrical charge that is optically injected into the IC wafer or chip at the fine location by nonlinear optical interaction.

8. The imaging method of claim 7 wherein the photon energy of the pulsed focused optical beam is lower than a bandgap of the active layer and the photon energy of the pulsed focused optical beam is 1.0 eV or lower.

9. The imaging method of claim 1 further comprising generating the focused optical beam using a fiber laser in which the fiber is doped with ytterbium and/or erbium.

10. The imaging method of claim 1 further comprising generating the focused optical beam using a fiber-based femtosecond laser.

11. The imaging method of claim 1 wherein:
the output signal acquired at each fine location includes a waveform, and
the acquiring of the 2D image or mapping tile further includes processing the waveform acquired at each fine location using the electronic processor to produce a single value or dataset of values for the fine location in the 2D image or mapping tile.

12. The imaging method of claim 1 wherein:
the output signal acquired at each fine location includes data collected from two or more sensors, and
the acquiring of the 2D image or mapping tile further includes processing the data collected from two or more sensors at each fine location using the electronic processor to produce a single value or dataset of values for the fine location in the 2D image or mapping tile.

13. The imaging method of claim 1 wherein:
the focused optical beam comprises a pulsed focused optical beam generated by a laser driven by a radio frequency (RF) signal, and
the acquiring of the output signal includes lock-in amplification of the output signal using a reference signal generated at a repetition rate of and phase-locked to the pulsed focused optical beam.

14. An imaging device comprising:
means for sequentially mechanically positioning a focal point of a focused optical beam at coarse locations of a set of coarse locations in or on an integrated circuit (IC) wafer or chip;
means for, with the focal point of the focused optical beam positioned at each coarse location, acquiring a two-dimensional (2D) image tile, wherein the means for acquiring the 2D image tile includes:
(i) means for steering the focal point of the focused optical beam to fine locations of a 2D set of fine locations on or in the IC wafer or chip using electronic beam steering, and
(ii) means for, with the focal point of the focused optical beam positioned at each fine location, acquiring an output signal produced in response to an electrical charge that is optically injected into the IC wafer or chip at the fine location by the focused optical beam, the acquiring of the output signal including acquiring an electrical signal produced by the IC wafer or chip in response to the electrical charge that is optically injected into the IC wafer or chip at the fine location by the focused optical beam; and
means, including an electronic processor, for combining the 2D image tiles including stitching together overlapping 2D image tiles to generate an image of the IC wafer or chip.

15. The imaging device of claim 14 wherein:
the means for sequentially mechanical positioning comprises a mechanical translation stage on which the IC wafer or chip is disposed; and
the means for steering comprises a galvo mirror for electronically steering the focused optical beam.

16. The imaging device of claim 14 further comprising:
means for generating the focused optical beam, including a femtosecond fiber laser.

17. The imaging device of claim 16 wherein the femtosecond fiber laser comprises a fiber doped with ytterbium and/or erbium.

18. An imaging device comprising:
a laser and an optical train configured to generate a focused optical beam;
a mechanical translation stage on which an integrated circuit (IC) wafer or chip is disposed, the mechanical translation stage being operable to sequentially position a focal point of the focused optical beam at coarse locations of a set of coarse locations in or on the IC wafer or chip;
a beam steering device configured to, with the focal point of the focused optical beam positioned at each coarse location using the mechanical translation stage, steer the focal point of the focused optical beam to fine locations of a two-dimensional (2D) set of fine locations on or in the IC wafer or chip using electronic beam steering; and
a readout device configured to, with the focal point of the focused optical beam mechanically positioned at each coarse location by the mechanical translation stage, acquire a 2D image or mapping tile for each coarse position by acquiring output electrical signals produced by the IC wafer or chip in response to electrical charge that is optically injected into the IC wafer or chip at the fine locations of the 2D set of fine locations by the focused optical beam.

19. The imaging device of claim 18 further comprising:
an electronic processor programmed to combine the 2D image or mapping tiles to generate an image or mapping of the IC wafer or chip including stitching together overlapping 2D image or mapping tiles.

20. The imaging device of claim 19 wherein:
the mechanical translation stage is a three-dimensional (3D) translation stage;
the set of coarse locations is a 3D array of coarse locations; and
the electronic processor is programmed to combine the 2D image or mapping tiles to generate the image or mapping of the IC wafer or chip as a 3D image or mapping of the IC wafer or chip.

* * * * *